United States Patent [19]

Bridgewater et al.

[11] Patent Number: 4,555,623

[45] Date of Patent: Nov. 26, 1985

[54] PRE-AMPLIFIER IN FOCAL PLANE DETECTOR ARRAY

[75] Inventors: Walter F. Bridgewater, Santa Clara; Robert E. De Caro, Hermosa Beach; Roger Larson, Fullerton; Llewellyn E. Wall, Irvine, all of Calif.

[73] Assignee: Irvine Sensors Corporation, Costa Mesa, Calif.

[21] Appl. No.: 558,099

[22] Filed: Dec. 5, 1983

[51] Int. Cl.⁴ ............................................. H01J 40/14
[52] U.S. Cl. .................................. 250/214 A; 330/59
[58] Field of Search ............... 250/214 A, 214 R, 206; 330/59, 253, 260

[56] References Cited

PUBLICATIONS

Jaeger; Active Load for Differential Amplifiers; Mar. 1974; IBM Tech. Disclosure Bulletin, vol. 16, #10, 3140–41.

Primary Examiner—David C. Nelms
Assistant Examiner—J. Gatto
Attorney, Agent, or Firm—Thomas J. Plante

[57] ABSTRACT

A pre-amplifier located "at the focal plane" of a detector array is disclosed which uses MOSFET transistors operated in the "weak inversion" region to provide operational amplifier performance. The dimensions of certain of the transistors are designed to minimize noise amplification. Feedback resistance for the operational amplifier is provided by switched capacitance using MOSFET transistors as switches, thereby permitting adjustment of the amplifier gain. Implanted and non-implanted MOSFET transistors are used in the differential amplifier in such a way as to avoid the need for a biasing network.

11 Claims, 3 Drawing Figures

PRE-AMPLIFIER IN FOCAL PLANE DETECTOR ARRAY

BACKGROUND OF THE INVENTION

The efforts which have extended over a long period and which have culminated in the present invention were aimed at providing a photo-detector signal amplifier useful in focal plane mosaic arrays. The problem is to provide satisfactory pre-amplification, at the focal plane, of each individual detector signal from the densely-packed infrared photo-detectors in a mosaic array.

The extremely high density requirement and the operating environment of such focal plane photo-detector arrays have created a problem for researchers in this field, which has only been satisfactorily resolved by the present invention. Among the very stringent limiting factors are the following:

(1) Space limitations. The amount of "real estate" available for pre-amplifiers receiving the individual detector signals should be as small as possible; and a value of approximately 800 square mils or less for each preamplifier is considered the required area specification.

(2) Low power limitations. Partly because of the extremely high density, and partly because of the operating environment, which utilizes cryogenic temperatures (less than 120° K.) for detector efficiency, the power dissipation of the pre-amplifier must be kept extremely low.

(3) High gain requirements. In spite of the foregoing limitations, each pre-amplifier must supply a very high gain because the signal sensed by the detector is extremely weak. Since the available space is so drastically limited, the number of transistors in the pre-amplifier is severely restricted.

(4) DC bias requirements. It is very important that the DC bias point of the detector input to the pre-amplifier have both (a) a very "low" value (below 10 millivolts), and (b) a very stable value. In other words, the DC bias point at the pre-amplifier input should be held at a substantially constant value, within a range of a few millivolts from the detector reference voltage (which conveniently is ground). Without this DC bias point "low" value and stability, noise tends to be excessive, dynamic range is unduly limited, and bandwidth is unduly limited.

(5) Low noise requirements. The background are created by the detector's environment, and the noise created by the detector itself, are unavoidable. But it is important that any noise created within the pre-amplifier be less than the sum of the unavoidable noises, in order to maximize the sensitivity of the system. Once the pre-amplifier noise is reduced below that sum, no further noise reduction in the pre-amplifier is necessary.

(6) Variable gain adjustability. It is highly desirable to provide a pre-amplifier whose gain can be adjusted to adapt to different operating situations.

The focal plane electronic systems proposed prior to, or concurrently with, the present invention have been deficient in most of the aspects discussed above.

Generally, the efforts to solve the problem have relied on charge coupled devices (CCDs), in which a stored charge at the semiconductor surface can be made to propagate along the surface via potential wells created by a series of MOS structures. Amplifications in CCDs is accomplished by "pumping" the charge into successively smaller wells.

Where pre-amplification transistors have been tried in focal plane systems, they have been single transistor units intended to provide sufficient gain to introduce the signal into a subsequent amplification stage, such as CCDs.

While such efforts may have met the space limitations and low power dissipation requirements stated above, they have not provided low and stable DC bias, high amplifier gain, low noise, or variable gain.

In other environments than the extremely demanding focal plane electronics package under consideration, the use of operational amplifiers might have been considered, because of their known virtues. However, the only technology suitable for the low temperature environment is MOSFET technology, which in a multi-transistor system was considered to require power dissipation far beyond the limits permissible in focal plane amplification. This essentially universal assumption of others working in this field has proved to be a major error; but it may have resulted from the predominance of digital technology as the field of use of MOSFET devices, and particularly of CMOS integrated circuitry.

STATEMENT OF THE INVENTION

The present invention provides a very successful solution of the problems outlined above by utilizing CMOS integrated circuitry (IC) as an operational amplifier (op amp) including a differential amplifier portion whose transistors operate in the weak-inversion region (also called sub-threshold, or current-starved).

Solution of the noise problems in weak-inversion operation requires greater "real estate" in the focal plane structure, but a surprisingly high gain (over 10,000) permits a single amplification stage to provide the sole focal plane amplification, thereby realizing the benefits of using fewer transistors and having freedom from the oscillation problems of multi-stage amplification.

In providing an output signal by using a pair of output transistors as a current mirror to add the amplification of the two transistors in the differential pair, operation in the weak-inversion region requires that the areas of the input and output transistor pairs be similar (within, say, a factor of two), in order to minimize noise amplification.

It is also desirable that the feedback resistance of the op amp be provided by switched capacitance, which not only provides a reliable IC resistance equivalent and, therefore, consistency of amplifier gain; but also in the present environment has the very important advantages of (a) helping to provide a low and stable DC bias, and (b) permitting adjustability of the amplifier gain to be accomplished by changing the frequency of the switched capacitance circuit.

Another feature of the invention involves combining implanted and non-implanted MOSFET transistors in the differential amplifier (which includes a cascode pair) in such a way that the gates of both cascode transistors and of one differential transistor can all be connected directly to ground, i.e., no special biasing network is required.

DETAILED DESCRIPTION OF SPECIFIC EMBODIMENT

Reference is made to U.S. application Ser. No. 187,787, filed Sept. 16, 1980, and assigned to the assignee of this application, for a full description of a focal plane modular array of the type in which the present invention can be incorporated with particularly useful results. That application discloses a stack of silicon chips secured together to form a module, which is used to provide an extremely dense detector array at the focal plane. The stacked chips, each of which may have an area as small as, or even smaller than, 500 mils by 500 mils, extend in planes perpendicular to the focal plane; and the detectors are supported on the focal plane, each in electrical contact with a lead on the edge of one of the chips, whose surface carries substantial electronic processing circuitry located at the focal plane.

Figure 1:
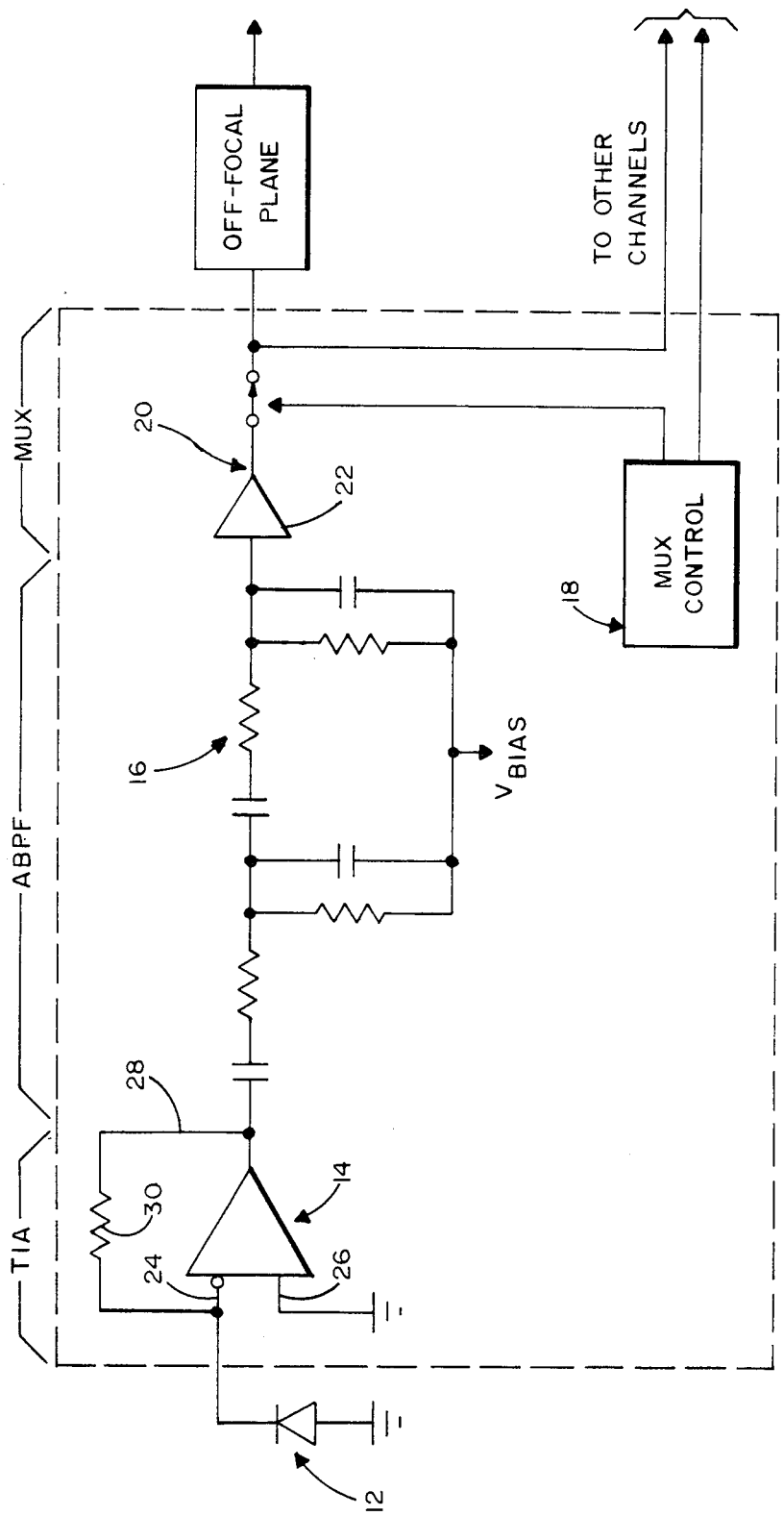
FIG. 1 is a schematic of the circuit which normally will be located at the focal plane.

FIG. 1, which is substantially identical with FIG. 1 of U.S. application Ser. No. 403,004, filed July 29, 1982, and also assigned to the assignee of this application, shows focal plane electronic circuitry including the trans-impedance amplifier which is the subject of the present invention. The circuitry of FIG. 1 is designed to be formed as integrated circuitry of one of the stacked silicon chips of application Ser. No. 187,787. Each chip will have a large number of individual photo-detector circuits (say 128) feeding into a multiplexer, which is also on the chip.

As shown in FIG. 1, an individual photo-detector 12 provides an input signal to a trans-impedance amplifier 14, which is the focus of the present application. The output of amplifier 14 (also referred to as a pre-amplifier, because it directly receives the photo-detector signal) may be passed through an adaptive bandpass filter 16, and then fed into a multiplexer, which may, for example, be similar to that disclosed in application Ser. No. 403,004. In the circuitry of that application, the multiplexer comprises branches 20 and their control circuitry 18. Each branch 20 provides further amplification of each detector signal, as indicated diagrammatically at 22.

The pre-amplifier of the present application is a single gain stage amplifier. Although other amplification may be provided on the focal plane, neither the pre-amplifier input nor its output are connected directly to another stage of amplification. This avoids the difficulty of adjusting frequency compensation to eliminate oscillation problems which may be encountered with multi-stage amplification.

As shown in FIG. 1, the pre-amplifier 14 is an operational amplifier (op amp) having its inverting input 24 connected to the photo-detector 12, its non-inverting input 26 connected to ground, and a feedback connection 28, including a resistance 30, between its output and its inverting input.

Figure 2:
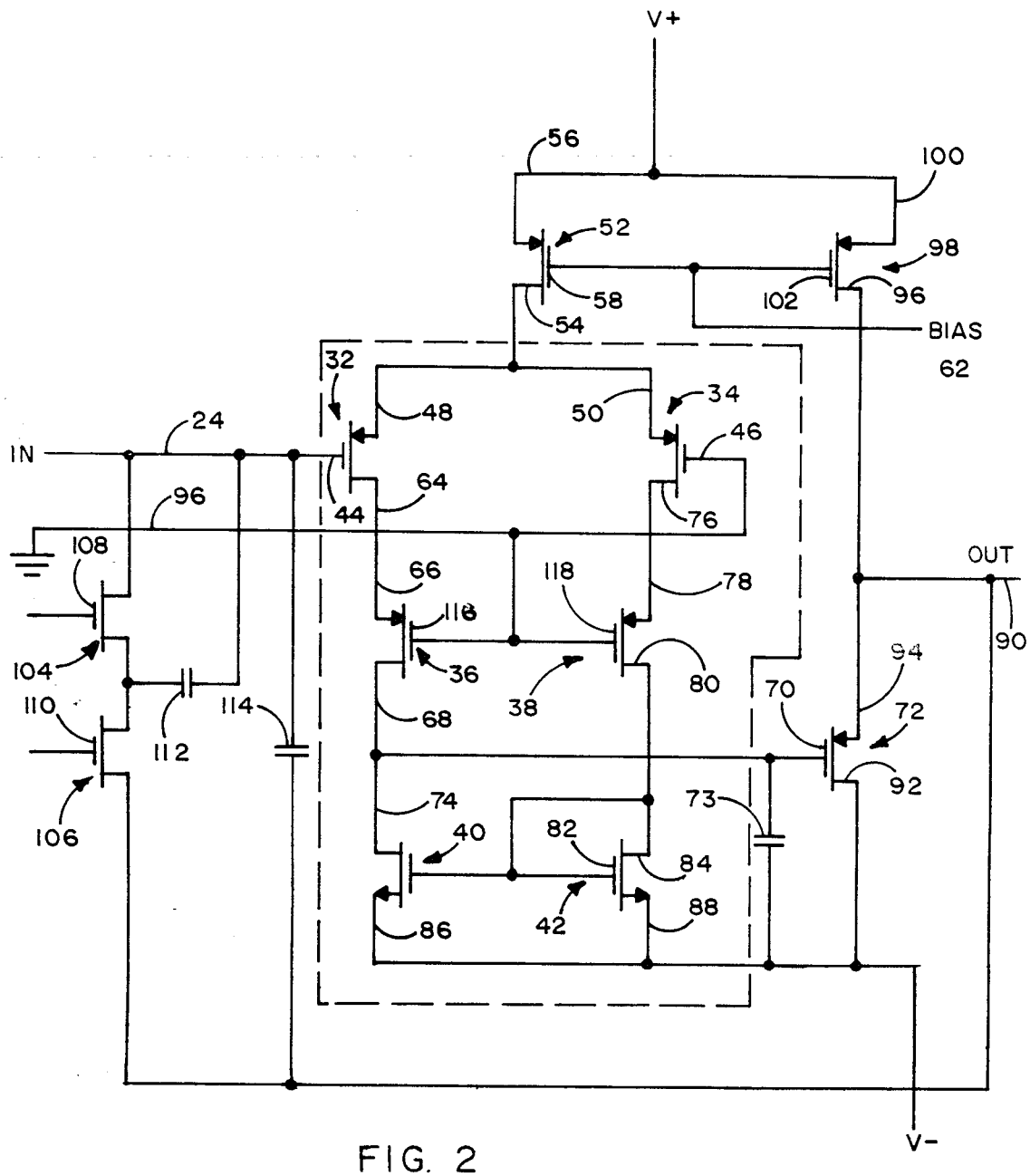
FIG. 2 shows the details of the trans-impedance amplifier circuit which is shown diagrammatically as part of FIG. 1.

FIG. 2 shows the pre-amplifier circuit which provides the op amp 14, which has also been termed a "trans-impedance" amplifier. The pre-amplifier circuit includes a differential amplifier portion, a feedback network, an output-connected source follower, and two constant current sources for the differential stage and the source follower, respectively.

The differential amplifier portion, in the version shown, which is enclosed by dashed lines, has six transistor elements. A differential pair is provided by transistors 32 and 34; a cascode pair by transistors 36 and 38; and a current mirror pair by transistors 40 and 42.

Transistor 32 of the differential pair has its gate 44 connected to the detector signal; and transistor 34 of the differential pair has its gate 46 connected to ground. The two transistors 32 and 34 are matched as closely as possible, having identical dimensions, e.g., a width of 250 microns and a length of 150 microns. The integrated circuitry includes both N-channel and P-channel MOSFET devices. The differential pair 32 and 34 are preferably P-channel devices, because of their lower noise. The cascode pair 36 and 38 are also P-channel devices; and the current mirror pair 40 and 42 are N-channel devices. The dimensions of transistors 36 and 38 of the cascode pair should be substantially identical to one another; and the dimensions of transistors 40 and 42 of the current mirror pair should be substantially identical to one another.

The source 48 of transistor 32, and the source 50 of transistor 34, are both connected to a constant current source, which maintains a predetermined current flow in the differential pair, the cascode pair, and the current mirror pair. The constant current source includes a MOSFET transistor 52, the drain 54 of which is connected to the sources 48 and 50 of the differential pair. The current flow of transistor 52 is determined by the voltage between its source 56 and gate 58, which are connected, respectively, to a positive voltage source V+ and a bias voltage shown at 62. (The specific circuit establishing the bias voltage between the source 56 and gate 58 of transistor 52 is not shown.)

Assuming the transistors 32 and 34 of the differential pair are identical, having identical widths and identical lengths, the current from the constant current source will divide equally between the differential pair, half flowing from source 48 to drain 64 of transistor 32 and thence to source 66 of transistor 36 of the cascode pair. Current flowing from source 66 to drain 68 of transistor 36 is connected to the gate 70 of a source follower transistor 72, and also to the drain 74 of transistor 40 of the current mirror pair.

The other half of the current from the constant current source flows from source 50 to drain 76 of transistor 34 and thence to source 78 of transistor 38 of the cascode pair. Current flowing from source 78 to drain 80 of transistor 38 is connected to the gate 82 and drain 84 of transistor 42 of the current mirror pair; i.e., transistor 42 is diode-connected. The source 86 of transistor 40 and the source 88 of transistor 42 are connected to a negative voltage source V−.

The six transistors which constitute the differential portion of the pre-amplifier perform their normal functions. The differential pair 32 and 34 amplify the changes in the incoming photo-detector signals. The cascode pair 36 and 38 avoid the "Miller" effect, i.e., they prevent amplification of the input capacitance (which is primarily at transistor 32). The current mirror pair 40 and 42 cause the output amplification to combine the effects of the differential pair 32 and 34.

A necessary difference in the circuitry thus far described from most other differential amplifiers is that it is operated in the weak-inversion region, and should not at any time operate in the strong-inversion region. This has a significant two-fold result: (1) it holds the power requirements of the amplifier within acceptable limits;

and (2) it creates an extremely high amplification factor, e.g., 10,000 to 1.

Figure 3:
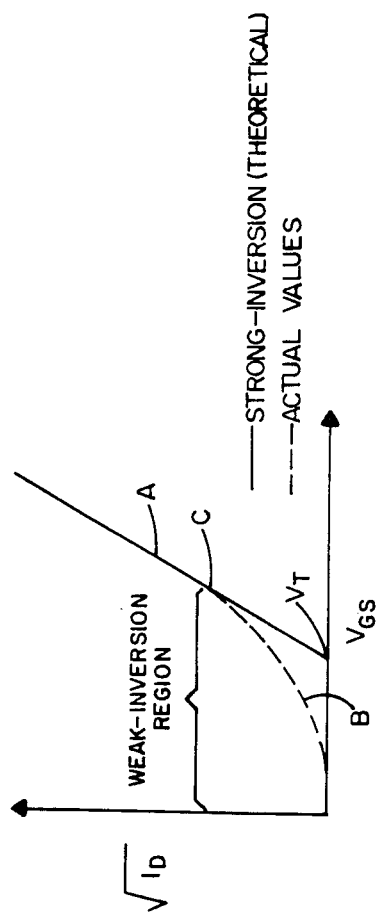
FIG. 3 is a graphic illustration of the weak-inversion region in which the amplifier transistors operate.

FIG. 3 illustrates the distinction between the weak-inversion region and the strong-inversion region. The latter is the normal operating range of MOSFET devices, which are generally used in digital systems. In such systems, speed of operation is required, which is obtainable only in strong-inversion. In general, in such systems, it is considered desirable to make the inversion as strong as possible.

In FIG. 3, the square roots of source-to-drain current values are plotted on the Y-axis and the gate-to-source voltage values are plotted on the X-axis. The term V(T) represents the threshold voltage of the transistor. The solid line A represents the theoretical curve for strong-inversion operation. The dashed line B represents the actual operating curve in the weak-inversion region. In other words, actual functioning of the transistor is represented by the dashed line, until it intersects solid line A at C. The upper portion of solid line A represents actual functioning of the transistor in the strong-inversion region.

For the purposes of the present invention, the current values in the pre-amplifier circuit should all be kept within the weak-inversion region represented by the dashed line in FIG. 3, i.e., in the region left of point C in the figure; and they preferably should be moved toward the left to the extent reasonably feasible.

Operation of the present pre-amplifier in the weak-inversion region is ensured by the constant current source previously described, which should supply current at very low levels, e.g., measured in tens of nanoamps.

The output signal on line 90 is provided by source-follower 72, whose drain 92 is connected to the negative reference voltage V—, and whose source 94 is connected to the drain 96 of a constant current source transistor 98, which provides (in conjunction with its bias voltage) a current source for transistor 72. The source 100 of constant current source transistor 98 is connected to the positive voltage source V+, and its gate 102 is connected to the same bias voltage 62 as the gate 58 of constant current source transistor 52. Since the gate-to-source voltages on transistors 98 and 52 are equal, their source-to-drain current values differ in accordance with their width-to-length ratios. In the experimental embodiment of the invention, the lengths of transistors 52 and 98 are the same; and the width of transistor 98 is approximately three times the width of transistor 52. This means that the amount of current flowing through the source follower 72 will be approximately three times that flowing through the differential portion of the circuit. The output at 90 will, therefore, have a voltage gain of approximately unity, but a current flow three times as large as that in the differential portion.

The differential current swing due to changes in the photo-detector-generated signal at gate 44 of transistor 32 will cause a gate-to-drain voltage change at source-follower 72 which, as previously stated, can provide voltage amplification of 10,000 or more. A capacitor 73 is connected between the gate 70 of source follower 72 and the negative voltage reference V—, for the purpose of providing frequency compensation, in order that the pre-amplifier will be stable for all feedback values, i.e., in order to avoid oscillation of the pre-amplifier.

For an operational amplifier which performs in the manner required by the present invention, a very stable and extremely high feedback resistance is needed. This is preferably accomplished by using a switched capacitance network, MOSFET transistors 104 and 106 function as clock-controlled switches, i.e., their respective gates 108 and 110 alternately receive signals, at a clock-established frequency, which cause current flow and current cut-off between their source and drain connections. When source-to-drain current flows in switch 106 (but not in switch 104), capacitor 112 tends to charge because it is across the feedback connection established between the output line 90 and the input line 24. When source-to-drain current flows in switch 104 (but not in switch 106), capacitor 112 tends to discharge. The high and low voltages reached by capacitor 112, together with the switching frequency, provide a very high and very accurate feedback-resistance-equivalent for the operational amplifier, thus combining the advantage of fixed pre-amplifier gain with high pre-amplifier gain.

Two features which assure proper operation of the present amplifier in combination with the switched capacitance circuit are: (a) using capacitor 114 in parallel with the switched capacitance circuit, in order to help reproduce output fluctuations due to the switching; and (b) selecting a switching frequency significantly higher than any frequency the pre-amplifier can transmit.

An additional advantage of the use of a switched capacitance circuit to provide the feedback resistance equivalent is the ability to change the gain of the pre-amplifier by changing the clock frequency which controls the switches 104 and 106.

One of the features of the present invention is the arrangement for biasing the gates of the cascode pair 36 and 38 without using a special biasing network. The differential pair of MOSFETS 32 and 34 and the cascode pair of MOSFETS 36 and 38 are all P-channel devices. However, the differential devices 32 and 34 are non-implanted, or "natural" devices, whereas the cascode devices 36 and 38 are implanted (ion-implanted) devices. This permits gate 116 of cascode device 36, gate 118 of cascode device 38, and gate 46 of differential device 34, all to be directly connected to ground, as shown. The voltage between the drain and source of each transistor has to be greater than 0.5 V and preferably about 1 V. Therefore, the source of cascode transistor 36 has to be negative with respect to the source of differential transistor 32 by about 1 V. By implanting transistors 36 and 38, but not implanting transistors 32 and 34, a condition is created in which (a) the gates can all be grounded (gate 44 of transistor 32 is essentially at ground), but (b) the necessary voltage will exist between the series transistors 32 and 36, and between the series transistors 34 and 38. Assuming the same current flow through the differential and cascode transistors in series, each of the transistors 32 and 34, which are not implanted, has a relatively large gate-to-source voltage, in the order of almost 2 V; whereas each of the transistors 36 and 38, which are implanted, has a gate-to-source voltage of about 1 V. The difference provides the necessary 1 V difference between the sources of the differential and cascode transistors in each series. Thus the need for a special biasing network is eliminated.

One of the surprising findings in connection with the present invention has to do with the internal noise control problem, and its relation to the areas of the differential transistors 32 and 34 and the current mirror transistors 40 and 42. In MOSFET transistors, low frequency noise is known to reduce as the transistor area is increased. In strong-inversion CMOS circuitry, which has generally been the predominant field of interest, two noise-reducing effects have been available, which experience has shown are not available when weak-inversion is used. Those two effects have been: (1) the ability to control noise by providing differential pair transistors having adequate area (while using much smaller current mirror transistors); and (2) the ability to use the geometry, i.e., the width-to-length ratio, of the differential pair transistors, as well as their total area, as a means of noise control. Both of these effects have permitted adequate noise control with relatively small area requirements in strong-inversion CMOS circuitry.

However, experimentation with the weak-inversion circuitry of the present invention has demonstrated that noise control requires that the areas of the current mirror transistors, as well as the areas of the differential transistors, must be kept relatively large in order to minimize internal noise generation in the operational amplifier. Also, this experimentation has demonstrated that manipulation of the width-to-length ratio does not significantly affect the noise problem in weak-inversion amplifiers.

In general, it appears that the areas of the differential transistors 32 and 34 (which should be identical with one another) should be similar to the areas of the current mirror transistors 40 and 42 (which also should be identical with one another). It is considered undesirable to have the areas of one pair more than about twice the areas of the other pair. For example, in the circuit shown in FIG. 2, the transistors 32 and 34 are each 250 microns wide by 150 microns long, each having an area of 37,500 square microns; whereas the transistors 40 and 42 are each 125 microns wide by 360 microns long, each having an area of 45,000 square microns.

The pre-amplifier circuitry, as described, provides numerous advantages. One of the most important is the "low" and stable DC bias. This is due primarily to two factors. The first factor is the use of a carefully matched differential pair of transistors, thus guaranteeing that the two inputs to the amplifier will be substantially equal in voltage to one another. The second factor is the extremely high amplifier gain, this requiring a very small fluctuation of voltage at the amplifier input (i.e., the fluctuation caused by variations in current from the photo-detector). The amplifier input can only move a few millivolts. This maintains the DC bias of the photo-detector circuit (i.e., 25 its operating point) at substantially the same point in its current/voltage curve. This factor is of great importance (particularly in the infrared region), because significant variations of the DC bias point, which are experienced in other focal plane circuitry, can radically change the performance of the photo-detectors.

As previously stated, the internal noise of the pre-amplifier is controlled by providing adequate areas of both the differential pair transistors and the current pair transistors. Although the area required by the differential and current mirror transistors is greater because of the weak-inversion noise characteristics, the surprisingly high gain provided by weak inversion eliminates the need for a second state of amplification, which constitutes a substantial real estate benefit.

Common mode noise, including noise from the current source, is compensated by the differential effect, and does not effect the output on line 90. An important noise reduction benefit is also realized by the low offset voltage between the gates of the differential transistors. The gate 44 of transistor 32, which receives the photo-detector input, is only millivolts from ground, thus providing minimum voltage difference (noise) at the pre-amplifier.

The amount of current flow in the amplifier is determined by its power output, which is maintained at a very low level for the reasons discussed in the introductory portion of the specification.

As current input from the photo-detector varies, current increases in one of the differential transistors, and decreases in the other, thereby providing the differential signal which is converted into a full output voltage swing by the current mirror transistors. The output voltage variations are between line 90 and ground, and are input to the next portion of the signal processing circuitry, which is illustrated in FIG. 1 as adaptive bandpass filter 16.

From the foregoing description, it will be apparent that the devices disclosed in this application will provide the significant functional benefits summarized in the introductory portion of the specification.

The following claims are intended not only to cover the specific embodiments disclosed, but also to cover the inventive concepts explained herein with the maximum breadth and comprehensiveness permitted by the prior art.

What is claimed is:

1. A focal plane optical-electronics systems comprising:
   a plurality of densely packed photo-detectors, each electrically connected to a separate circuit;
   a single-stage pre-amplifier in each photo-detector circuit having its input connected to its photo-detector and including a matched differential pair of MOSFET transistors;
   means in each photo-detector circuit for limiting the current available to the pre-amplifier to cause it to operate in the weak-inversion mode; and
   means in each photo-detector circuit for providing feedback resistance between the pre-amplifier output and its photo-detector input.

2. The focal plane optical-electronics system of claim 1 in which the pre-amplifier also includes a matched current mirror pair of MOSFET transistors to provide a single pre-amplifier output signal, the areas of the differential transistors and the current mirror transistors being substantially similar in order to minimize internal noise.

3. The focal plane optical-electronics system of claim 1 in which the areas of the transistors of one pair are no greater than approximately twice the areas of the transistors of the other pair.

4. The focal plane optical-electronics system of claim 2 in which the pre-amplifier also includes a matched cascode pair of MOSFET transistors between the differential pair and the current mirror pair.

5. The focal plane optical-electronics system of claim 4 in which:
   the differential transistors are non-implanted to provide a higher source-to-drain voltage;
   the cascode transistors are implanted to provide a lower source-to-drain voltage;
   the gates of both cascode transistors and one of the differential transistors are all connected to ground, and the gate of the other differential transistor is connected to the photo-detector.

6. The focal plane optical-electronics system of claim 2 which also comprises:

a source-follower MOSFET transistor having its gate connected to the out of the current mirror transistors and its source-to-drain current connected to the next stage of the focal plane electronic circuitry.

7. The focal plane optical-electronics system of claim 1 wherein the means for providing feedback resistance is a switched capacitance comprising a capacitor and two MOSFET switches.

8. In a focal plane electronics system for supplying individual signals from each photo-detector in an array of focal plane photo-detectors to electronic processing circuitry, a single gain stage trans-impedance pre-amplifier for each photo-detector having an area no greater than 800 squares mils and comprising:
 a differential pair of MOSFET transistors receiving a variable input signal directly from the respective photo-detector, said differential transistors operating solely in the weak-inversion region; and
 a pair of current mirror MOSFET transistors which provide a single output signal, said current mirror transistors operating solely in the weak-inversion region.

9. The pre-amplifier of claim 8 which also comprises:
 a switched capacitance circuit for providing a resistance equivalent between the output of the pre-amplifier and its photo-detector input.

10. The focal plane optical-electronics system of claim 7 which also comprises:
 means for changing the switching frequency of the switched capacitance, thereby changing the gain of the preamplifier.

11. The pre-amplifier of claim 9 which also comprises:
 means for changing the switching frequency of the switched capacitance, thereby changing the gain of the pre-amplifier.

* * * * *

UNITED STATES PATENT AND TRADEMARK OFFICE
CERTIFICATE OF CORRECTION

PATENT NO. : 4,555,623

DATED : November 26, 1985

INVENTOR(S) : Walter F. Bridgewater, Robert E. DeCaro, Roger Larson, and Llewellyn E. Wall It is certified that error appears in the above—identified patent and that said Letters Patent is hereby corrected as shown below:

Column 1, line 49: Change "are" to -- noise --.

Column 1, last line: Change "amplifications" to -- amplification --.

Column 6, line 2: Change the comma to a period.

Column 7, line 42: Change "this" to -- thus --.

Column 7, line 65: Change "effect" to -- affect --.

Claim 3, line 2: Change "1" to -- 2 --.

Signed and Sealed this

Twenty-fifth Day of February 1986

[SEAL]

Attest:

DONALD J. QUIGG

Attesting Officer

Commissioner of Patents and Trademarks